United States Patent
Dosho

(10) Patent No.: US 8,988,269 B2
(45) Date of Patent: Mar. 24, 2015

(54) TIME DIFFERENCE ADJUSTMENT CIRCUIT AND TIME-TO-DIGITAL CONVERTER INCLUDING THE SAME

(71) Applicant: Panasonic Corporation, Osaka (JP)

(72) Inventor: Shiro Dosho, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/109,644

(22) Filed: Dec. 17, 2013

(65) Prior Publication Data

US 2014/0104090 A1    Apr. 17, 2014

Related U.S. Application Data

(63) Continuation of application No. PCT/JP2010/004240, filed on Jun. 29, 2012.

(30) Foreign Application Priority Data

Aug. 1, 2011  (JP) ................ 2011-168138

(51) Int. Cl.
  *H03K 5/14* (2014.01)
  *H03K 5/26* (2006.01)
  *G04F 10/00* (2006.01)

(52) U.S. Cl.
  CPC .. *H03K 5/14* (2013.01); *H03K 5/26* (2013.01); *G04F 10/005* (2013.01)
  USPC ........................................ 341/166

(58) Field of Classification Search
  CPC ........... H03M 1/12; H03M 1/14; H03M 1/50; G04F 10/00; G04F 10/06; G04F 10/005; H03K 5/13; H03K 5/14; H03K 5/26; H03K 5/1515; H03K 5/15013
  USPC .................. 341/120–166; 330/69; 368/113; 375/329; 327/156, 158, 269, 361
  See application file for complete search history.

(56) References Cited

U.S. PATENT DOCUMENTS

| 5,631,582 A | 5/1997 | Fujikawa |
| 7,098,714 B2 * | 8/2006 | Lin ............................... 327/291 |

(Continued)

FOREIGN PATENT DOCUMENTS

| JP | 64-048516 A | 2/1989 |
| JP | 2007-150865 A | 6/2007 |
| JP | 3953009 B2 | 8/2007 |

OTHER PUBLICATIONS

Kinniment et al., "On-Chip Structures for Timing Measurement and Test," Proceedings of the Eighth International Symposium on Asynchronous Circuits and Systems (ASYNC '02) 2002, pp. 190-197.

(Continued)

*Primary Examiner* — Lam T Mai
(74) *Attorney, Agent, or Firm* — McDermott Will & Emery LLP

(57) ABSTRACT

A time difference adjustment circuit includes two flip-flop circuits, a delay circuit, and a reset circuit. The delay circuit includes first and second transistors of a first polarity and third and fourth transistors of a second polarity, wherein drains of the first and third transistors are coupled to each other, drains of the second and fourth transistors are coupled to each other, the drains of the first and third transistors and a gate of the fourth transistor are coupled to each other, an input signal is coupled to a gate of the first transistor, an output signal is supplied from the drains of the second and fourth transistors, and first and second reset signals are respectively coupled to gates of the second and third transistors.

4 Claims, 4 Drawing Sheets

(56) References Cited

U.S. PATENT DOCUMENTS

| | | | |
|---|---|---|---|
| 7,417,478 B2* | 8/2008 | Kim et al. | 327/158 |
| 7,492,847 B2* | 2/2009 | Chou | 375/355 |
| 7,629,819 B2* | 12/2009 | Kwak et al. | 327/158 |
| 7,916,064 B2 | 3/2011 | Lin et al. | |
| 8,164,368 B2* | 4/2012 | Blodgett et al. | 327/158 |
| 8,228,219 B2 | 7/2012 | Henzler et al. | |
| 8,482,443 B2* | 7/2013 | Kim et al. | 341/143 |
| 8,669,810 B2 | 3/2014 | Kwon et al. | |
| 2005/0062524 A1 | 3/2005 | Kato et al. | |
| 2007/0121761 A1 | 5/2007 | Dosho et al. | |
| 2008/0252790 A1* | 10/2008 | Serizawa | 348/663 |
| 2009/0184741 A1* | 7/2009 | Suda et al. | 327/158 |
| 2009/0225631 A1 | 9/2009 | Shimizu et al. | |
| 2012/0313803 A1 | 12/2012 | Dosho et al. | |
| 2013/0249627 A1 | 9/2013 | Kwon et al. | |
| 2013/0335251 A1 | 12/2013 | Dosho et al. | |

OTHER PUBLICATIONS

Lee et al., "A 9b, 1.25 ps Resolution Coarse—Fine Time-to-Digital Converter in 90 nm CMOS that Amplifies a Time Residue," IEEE Journal of Solid-State Circuits, Apr. 2008, vol. 43, No. 4, pp. 769-777.

Nakura et et., "Time Difference Amplifier Using Closed-Loop Gain Control," 2009 Symposium on VLSI Circuits Digest of Techinical Papers, pp. 208-209.

Abas et al., "Built-in time measurement circuits—a comparative design study," Computers & Digital Techniques, IET, 2007, vol. 1, No. 2, pp. 87-97.

Lee et al., "A 9b, 1.26ps Resolution Coarse-Fine Time-to-Digital Converter in 90nnn CMOS that Amplifies a Time Residue," 2007 Synoisuyn ib VLSI Circuits Digest of Technical Papers, pp. 168-169.

Wang et al., "An Ultra-Low-Power Fast-Lock-in Small-Jitter All-Digital DLL," 2005 IEEE International Solid-State Circuits Conference, Session 22, PLL, DLL and VSCOs, pp. 422, 423 and 607.

International Search Report issued in International Application No. Pcp/JP2011/004285 mailed Aug. 23, 2011, with partial English translation, 4 pgs.

International Search Report issued in International Application No. PCT/JP2012/004240 mailed Jul. 24, 2012, with partial English translation, 3 pgs.

International Search Report issued in International Application No. PCT/JP2010/005212 mailed Oct. 12, 2010, with partial English translation, 3 pgs.

U.S. Appl. No. 13/942,478, filed Jul. 15, 2013, 20 pgs.

Notice of Allowance issued in U.S. Appl. No. 13/589,550 dated Jul. 18, 2014.

* cited by examiner

TIME DIFFERENCE ADJUSTMENT CIRCUIT AND TIME-TO-DIGITAL CONVERTER INCLUDING THE SAME

CROSS-REFERENCE TO RELATED APPLICATIONS

This is a continuation of International Application No. PCT/JP2012/004240 filed on Jun. 29, 2012, which claims priority to Japanese Patent Application No. 2011-168138 filed on Aug. 1, 2011. The entire disclosures of these applications are incorporated by reference herein.

BACKGROUND

The present disclosure relates to time difference adjustment circuits for adjusting the time difference between edges of two input signals and time-to-digital converters including the same.

In recent years, the operating voltage of LSIs has been reduced due to reduction in size of the LSIs. Therefore, it has become difficult to increase the SN ratio of signals in signal processing along a voltage direction. For this reason, the analog quantity along a time axis direction, that is, time difference information has to be used to perform the signal processing, and in recent years, time-to-digital converters for performing digital conversion of the time difference information have been and are being developed.

In general, a time-to-digital converter includes a time difference adjustment circuit for adjusting the time difference between edges of two input signals. Specifically, the time difference adjustment circuit delays one of the two input signals by using a delay circuit to adjust the time difference between the edges of the two input signals. As a delay circuit, an inverter chain including a plurality of cascade-connected inverter circuits is used (For example, see Jinn-Shyan Wang, Yi-Ming Wang, Chin-Hao Chen, Yu-Chia Liu, "An Ultra-Low-Power Fast-Lock-in Small-Jitter All-Digital DLL," ISSCC 2005/SESSION 22/PLL, DLL, AND VCOs/22.7, 2005 IEEE International Solid-State Circuit Conference, pp. 422-423 and 607).

It is difficult for the inverter chain to provide a signal delay smaller than an inverter delay which is a signal delay of a single inverter circuit included in the inverter chain. Therefore, there is a need for a time adjustment circuit for adjusting the time difference between edges of two input signals with a delay amount smaller than the inverter delay and a time-to-digital converter including the same.

SUMMARY

According to an aspect of the present disclosure, a time difference adjustment circuit for adjusting a time difference between edges of two input signals includes: first and second flip-flop circuits each configured to receive a corresponding one of the two input signals as a clock input; a delay circuit configured to delay an output signal of the first flip-flop circuit to obtain a delayed signal, and output the delayed signal; and a reset circuit configured to detect an edge of an output signal of the delay circuit and an edge of an output signal of the second flip-flop circuit to output first and second reset signals having complementary logical values. The first and second flip-flop circuits are reset by the first or second reset signal. The delay circuit includes a plurality of cascade-connected minimum-delay units each including first and second transistors of a first polarity and third and fourth transistors of a second polarity. A drain of the first transistor is coupled to a drain of the third transistor. A drain of the second transistor is coupled to a drain of the fourth transistor. The drains of the first and third transistors are coupled to a gate of the fourth transistor. An input signal to each of the minimum-delay units is coupled to a gate of the first transistor. An output signal of each of the minimum-delay units is supplied from the drains of the second and fourth transistors. The first and second reset signals are respectively coupled to gates of the second and third transistors.

According to another aspect of the present disclosure, a time-to-digital converter circuit for converting a time difference between edges of two input signals to a 1-bit digital value and adjusting the time difference between the edges of the two input signals includes: the above-mentioned time difference adjustment circuit; a comparator configured to compare timings of the edges of the two input signals to output the digital value; first and second delay compensation circuits each configured to delay a corresponding one of the two input signals by a delay amount corresponding to a signal delay in the comparator; and a routing circuit configured to switch, according to the digital value, connections between each of outputs of the first and second delay compensation circuits and two inputs of the time difference adjustment circuit, between straight connection and cross connection.

According to still another aspect of the present disclosure, a time-to-digital converter for converting a time difference between edges of two input signals to a digital code includes: a plurality of cascade-connected time-to-digital converter circuits each of which is the above-mentioned time-to-digital converter circuit. A delay time of each of the time difference adjustment circuits in the time-to-digital converter circuits is set such that the delay time is reduced by a factor of two sequentially from the time-to-digital converter circuit in a first stage.

DESCRIPTION OF EMBODIMENTS

Embodiments of the present disclosure will be described below with reference to the drawings.

(Embodiment of Time Difference Adjustment Circuit)

Figure 1:
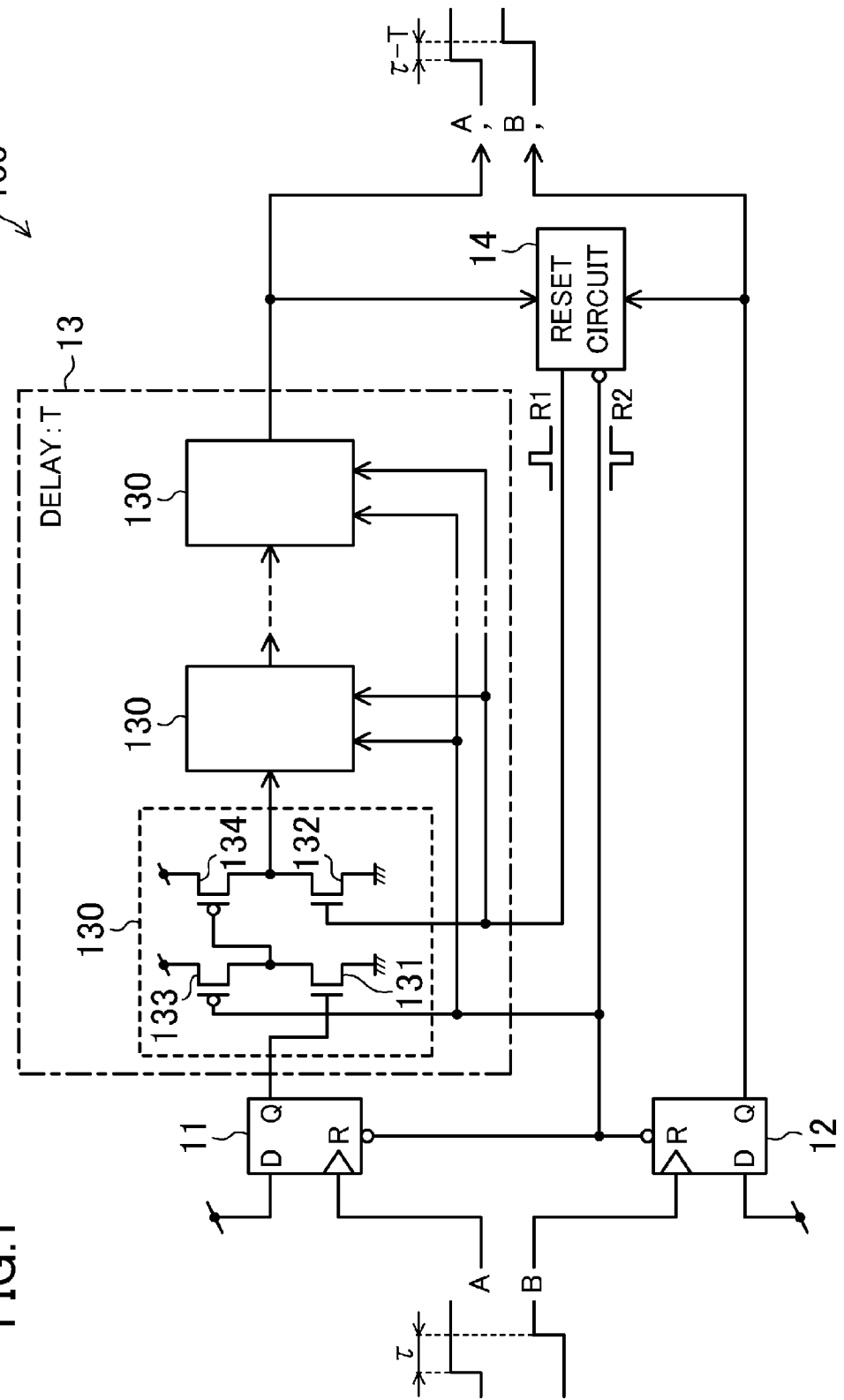
FIG. 1 is a view illustrating a configuration of a time difference adjustment circuit according to an embodiment of the present disclosure.

FIG. 1 illustrates a configuration of a time difference adjustment circuit according to an embodiment of the present disclosure. A time difference adjustment circuit 100 according to the present embodiment includes two flip-flop circuits 11 and 12, a delay circuit 13, and a reset circuit 14. The time difference adjustment circuit 100 is configured to adjust the time difference τ between edges of two input signals A and B to output two signals A' and B', where the time difference between edges of the two output signals A' and B' is (τ−T).

The edges may be rising edges or falling edges, and in the following description, the case where the time difference between rising edges is adjusted will be taken as an example for convenience sake.

The flip-flop circuits 11 and 12 may be formed by D flip flops provided with reset inputs. The flip-flop circuits 11 and 12 each receive a power supply voltage as a data input. The flip-flop circuit 11 receives the input signal A as a clock input, and the flip-flop circuit 12 receives the input signal B as a clock input. An output signal of the flip flop 12 corresponds to the output signal B'.

The flip-flop circuits 11 and 12 are reset by a reset signal R2 output from the reset circuit 14. That is, an output signal of the flip-flop circuit 11 transitions from low (L) to high (H) at a rising edge of the input signal A, and transitions from H to L when the flip-flop circuit 11 receives the reset signal R2. The output signal of the flip-flop circuit 12 transitions from L to H at a rising edge of the input signal B, and transitions from H to L when the flip-flop circuit 12 receives the reset signal R2.

The configuration of the time difference adjustment circuit may be modified such that the flip-flop circuits 11 and 12 are reset by a reset signal R1 output from the reset circuit 14.

The delay circuit 13 receives the output signal of the flip-flop circuit 11 and delays the received signal by time T. An output signal of the delay circuit 13 corresponds to the output signal A'. The detailed configuration of the delay circuit 13 will be described later.

Figure 2:
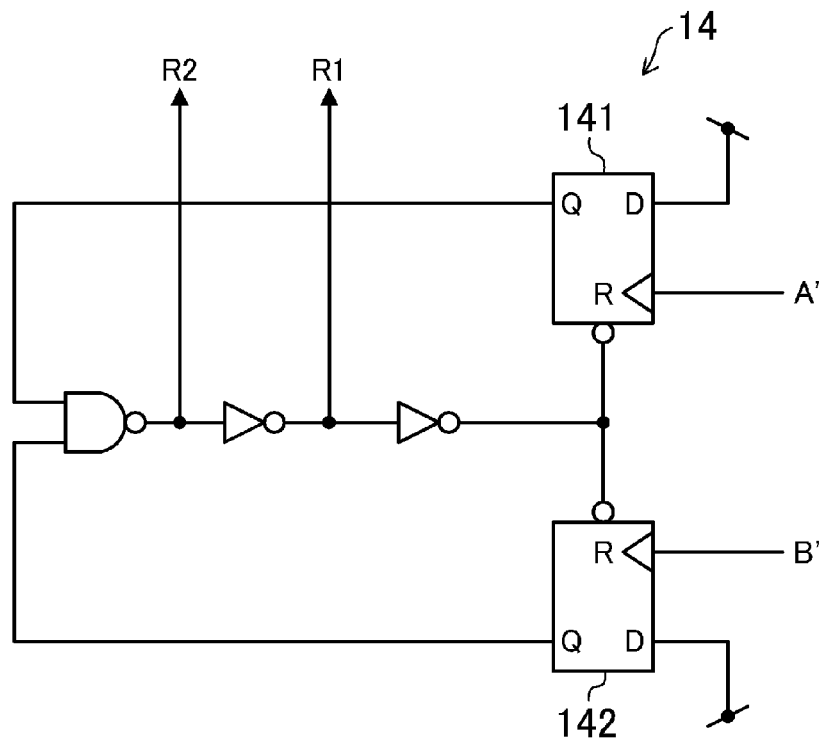
FIG. 2 is a view illustrating a configuration of the reset circuit in FIG. 1.

The reset circuit 14 detects a rising edge of the output signal of the delay circuit 13 and a rising edge of the output signal of the flip-flop circuit 12 to output the reset signals R1 and R2 having complementary logical values. For example, as illustrated in FIG. 2, the reset circuit 14 may include two D flip-flops 141 and 142 provided with reset inputs and some logic elements. The D flip-flops 141 and 142 each receive a power supply voltage as a data input. The D flip flops 141 receives the output signal A' as a clock input, and the D flip flops 142 receives the output signal B' as a clock input. A NAND of output signals of the D flip flops 141 and 142 is output as the reset signal R2, and an inversion of the NAND is output as the reset signal R1. The D flip flops 141 and 142 are reset by an inversion of the reset signal R1. That is, the reset circuit 14 detects rising edges of the output signals A' and B' to output the reset signal R1 which is a positive logic one shot pulse and the reset signal R2 which is a negative logic one-shot pulse.

Referring back to FIG. 1, the delay circuit 13 includes a plurality of cascade-connected minimum-delay units 130. Each minimum-delay unit 130 includes NMOS transistors 131 and 132, and PMOS transistors 133 and 134. The drain of the NMOS transistor 131 is coupled to the drain of the PMOS transistor 133. The drain of the NMOS transistor 132 is coupled to the drain of the PMOS transistor 134. The drains of the NMOS transistor 131 and the PMOS transistor 133 are coupled to the gate of the PMOS transistor 134. An input signal to each minimum-delay unit 130 is coupled to the gate of the NMOS transistor 131, and an output signal of each minimum-delay unit 130 is supplied from the drains of the NMOS transistor 132 and the PMOS transistor 134. The reset signals R1 and R2 output from the reset circuit 14 are respectively coupled to the gate of the NMOS transistor 132 and the gate of the PMOS transistor 133.

In response to a rising edge of a signal input to the gate of the NMOS transistor 131 in the minimum-delay unit 130, the NMOS transistor 131 operates as a delay element to allow transition of a signal output from the drain of the NMOS transistor 131 from H to L. Moreover, in response to a falling edge of a signal input to the gate of the PMOS transistor 134 in the minimum-delay unit 130, the PMOS transistor 134 operates as a delay element to allow transition of a signal output from the drain of the PMOS transistor 134 from L to H. Thus, coupling the drain of the NMOS transistor 131 to the gate of the PMOS transistor 134 forms a delay circuit to delay only the rising edge of the input signal to transfer the input signal with the delayed rising edge. When multiple ones of the delay circuits are cascade-connected, it is possible to delay only the rising edge of the input signal by an arbitrary delay amount to transfer the input signal with the delayed rising edge.

Each inverter circuit in a conventional inverter chain has to drive the gates of both an NMOS transistor and a PMOS transistor in an inverter circuit in a subsequent stage. In contrast, as in the present embodiment, in the delay circuit 13 including alternately cascade-connected NMOS transistors 131 and PMOS transistors 134, each NMOS transistor 131 or each PMOS transistor 134 may drive only the gate of the PMOS transistor 134 or the gate of the NMOS transistor 131 in a subsequent stage, so that the load is reduced to about one half of that in the case of the inverter chain. Therefore, the delay time related to signal transfer is also reduced to about one half of that in the case of the inverter chain, so that it is possible to obtain a delay amount smaller than the inverter delay. Moreover, a through current, or the like generated in the case of using the inverter circuit is not generated in the delay circuit 13, so that it is possible to reduce power consumption.

Since the delay circuit 13 is a circuit to delay only a rising edge of an input signal to transfer the input signal with the delayed rising edge, the delay circuit 13 has to be initialized each time before receiving an input signal. The flip-flop circuit 11, the NMOS transistor 132, and the PMOS transistor 133 are provided in order to initialize the delay circuit 13.

The delay circuit 13 is initialized as follows. When an output signal of the flip-flop circuit 11 propagates through the delay circuit 13 and a rising edge of the output signal A' is detected by the reset circuit 14, and a rising edge of the output signal B' is also detected by the reset circuit 14, the reset signals R1 and R2 are output. The PMOS transistor 133 is turned on when the PMOS transistor 133 receives the reset signal R2, and the potential of the drain of the PMOS transistor 133 transitions to a H level. This turns off the PMOS transistor 134 in a subsequent stage. The NMOS transistor 132 is turned on when the NMOS transistor 132 receives the reset signal R1, and the potential of the drain of the NMOS transistor 132 transitions to a L level. This turns off the NMOS transistor 131 in the subsequent stage. The NMOS transistor 131 in the first stage in the delay circuit 13 is turned off by the transition of the output signal of the flip-flop circuit 11 from H to L when the flip-flop circuit 11 receives the reset signal R2.

As described above, the delay circuit 13 is initialized when the delay circuit 13 receives the reset signals R1 and R2, so that the delay circuit 13 can delay a rising edge of a new input signal and output a signal with the delayed rising edge. That is, irrelevant to the number of connection stages, the minimum-delay units 130 can be reset at the same time, so that it is possible to improve the latency.

(Variation of Delay Circuit 13)

Figure 3:
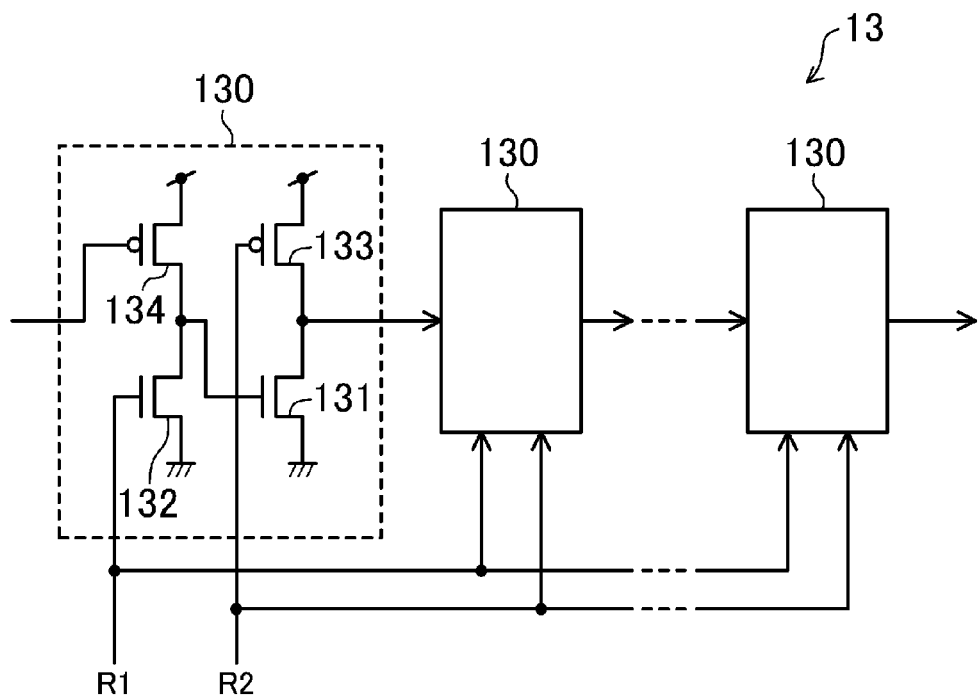
FIG. 3 is a view illustrating a configuration of a delay circuit according to a variation.

FIG. 3 illustrates a variation of the delay circuit 13. The configuration of the minimum-delay unit 130 is modified such that an input signal to each minimum-delay unit is coupled to the gate of the PMOS transistor 134, an output signal of each minimum-delay unit is supplied from the drains of the NMOS transistor 131 and the PMOS transistor 133, and the gate of the NMOS transistor 131 is coupled to the drains of the NMOS transistor 132 and the PMOS transistor 134. Thus, it is possible to form a delay circuit 13 configured to delay only a falling edge of the input signal by an arbitrary delay amount to transfer the input signal with the delayed falling edge. An inverted output of the flip-flop circuit 11 has to be coupled to the delay circuit 13 of the present variation. The delay circuit 13 according to the present variation is initialized in the same manner as described above.

(Embodiment of Time-to-Digital Converter)

Figure 4:
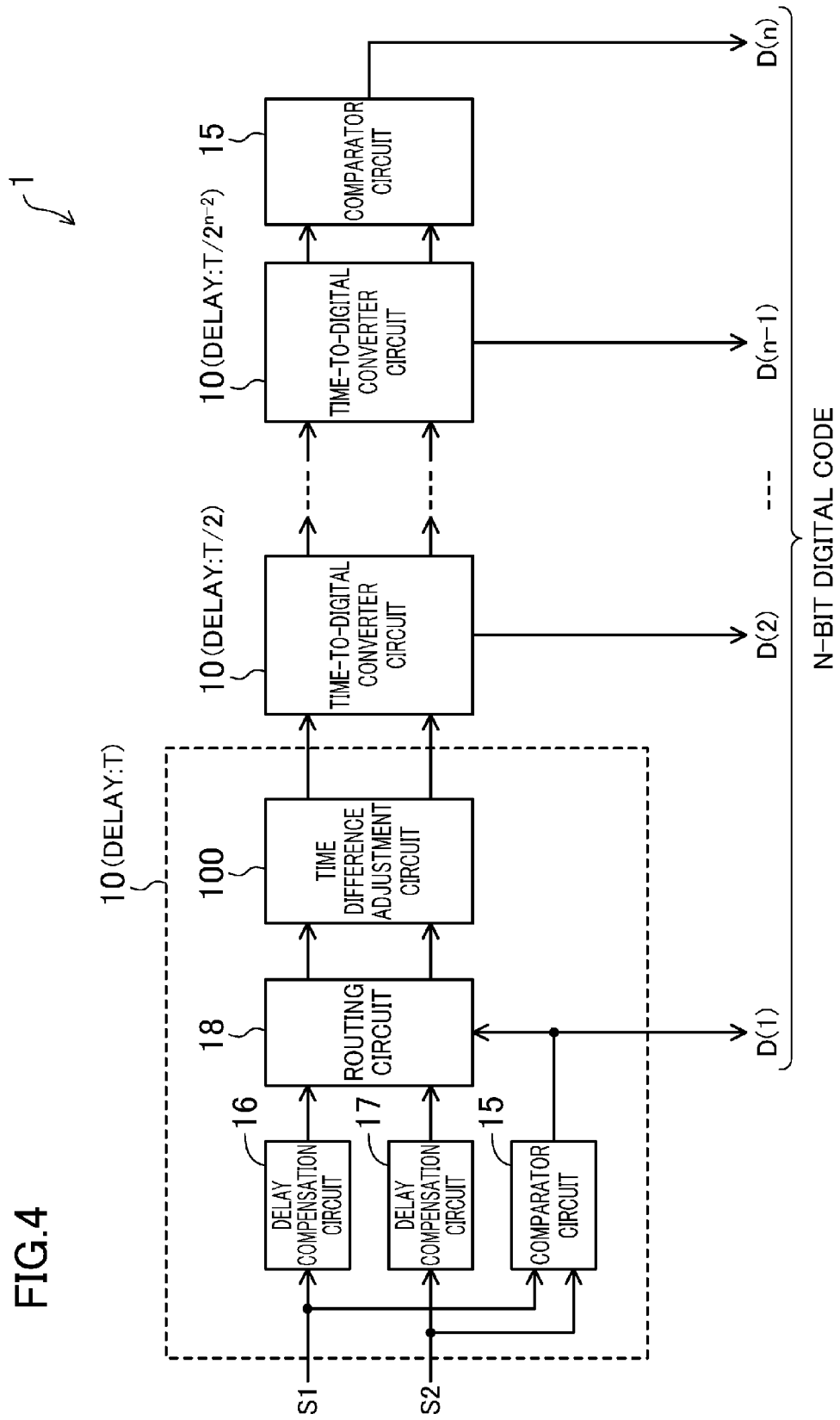
FIG. 4 is a view illustrating a configuration of a time-to-digital converter according to an embodiment of the present disclosure.

FIG. 4 illustrates a configuration of a time-to-digital converter according to an embodiment of the present disclosure. A time-to-digital converter 1 according to the present embodiment is configured to convert the time difference between edges of two input signals S1 and S2 to an n-bit digital code.

The edges may be rising edges or falling edges, and in the following description, the case where digital conversion of the time difference between rising edges is performed will be taken as an example for convenience sake.

The time-to-digital converter 1 includes (n-1) cascade-connected time-to-digital converter circuits 10 and a comparator 15 coupled to the time-to-digital converter circuit 10 in the last stage, the comparator 15 being one of components included in a time-to-digital converter circuit 10. Each time-to-digital converter circuit 10 is configured to convert the time difference between rising edges of two input signals to a 1-bit digital value D and to adjust the time difference between the rising edges of the two input signals.

Figure 5:
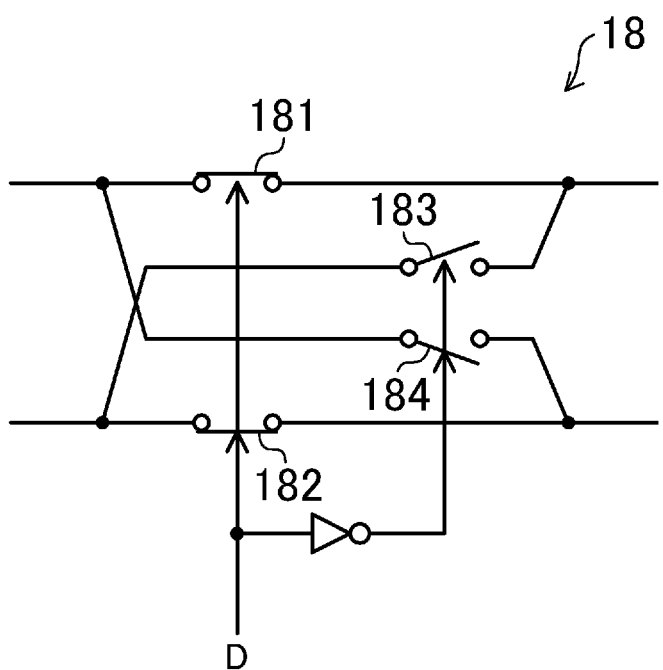
FIG. 5 is a view illustrating a configuration of the routing circuit in FIG. 4.

Specifically, each time-to-digital converter circuit 10 includes a comparator 15, two delay compensation circuits 16 and 17, a routing circuit 18, and a time difference adjustment circuit 100. The comparator 15 detects a lead/lag (i.e., timings) of the rising edges of the two input signals of the time-to-digital converter circuit 10 to output a 1-bit digital value D. Each of the delay compensation circuits 16 and 17 delays a corresponding one of the two input signals of the time-to-digital converter circuit 10 by a delay amount corresponding to the signal delay in the comparator 15. The inverter chain or the above-described delay circuit 13 can be used as each of the delay compensation circuits 16 and 17. The time difference adjustment circuit 100 is the time difference adjustment circuit according to the above-described embodiment. Outputs of the time difference adjustment circuit 100 are outputs of the time-to-digital converter circuit 10. According to the digital value D, the routing circuit 18 switches connections between outputs of the delay compensation circuits 16 and 17 and two inputs of the time difference adjustment circuit 100, between straight connection and cross connection. As illustrated in FIG. 5, the routing circuit 18 may include four switches 181, 182, 183, and 184.

The conversion input range of the time-to-digital converter 1 is defined as ±T. In this case, for example, the delay time is T in the first stage, T/2 in the second stage, and $T/2^{n-2}$ in the last stage ((n-1) stage), that is the delay time of the time difference adjustment circuit 100 in each time-to-digital converter circuit 10 (more specifically, the delay time of the delay circuit 13 in the time difference adjustment circuit 100) is reduced by a factor of two sequentially from the time-to-digital converter circuit 10 in the first stage. A digital value D(1) output from the time-to-digital converter circuit 10 in the first stage corresponds to the MSB of the digital code, and a digital value D(n) output from the comparator 15 coupled in the last stage corresponds to the LSB of the digital code.

According to the present embodiment, the time difference between edges of two signals output from the time-to-digital converter 10 in the last stage can be sufficiently smaller than the inverter delay, so that time difference digital conversion with extremely high resolution is possible.

Although a Gray-coded n-bit digital code is output from the time-to-digital converter 1, it is easy to convert the Gray code to a normal binary code.

The comparator 15 is provided in the last stage. This is only because the last stage is not required to transfer a signal to a next stage, and thus the delay compensation circuits 16 and 17, the routing circuit 18, and the time difference adjustment circuit 100 are omitted from the time-to-digital converter circuit 10. Thus, a time-to-digital converter circuit 10 may be provided in the last stage.

Other implementations are contemplated.

What is claimed is:

1. A time difference adjustment circuit for adjusting a time difference between edges of two input signals, comprising:
   first and second flip-flop circuits each configured to receive a corresponding one of the two input signals as a clock input;
   a delay circuit configured to delay an output signal of the first flip-flop circuit to obtain a delayed signal, and output the delayed signal; and
   a reset circuit configured to detect an edge of an output signal of the delay circuit and an edge of an output signal of the second flip-flop circuit to output first and second reset signals having complementary logical values, wherein
   the first and second flip-flop circuits are reset by the first or second reset signal,
   the delay circuit includes a plurality of cascade-connected minimum-delay units each including first and second transistors of a first polarity and third and fourth transistors of a second polarity,
   a drain of the first transistor is coupled to a drain of the third transistor,
   a drain of the second transistor is coupled to a drain of the fourth transistor,
   the drains of the first and third transistors are coupled to a gate of the fourth transistor,
   an input signal to each of the minimum-delay units is coupled to a gate of the first transistor,
   an output signal of each of the minimum-delay units is supplied from the drains of the second and fourth transistors, and
   the first and second reset signals are respectively coupled to gates of the second and third transistors.

2. A time-to-digital converter circuit for converting a time difference between edges of two input signals to a 1-bit digital value and adjusting the time difference between the edges of the two input signals, comprising:
   the time difference adjustment circuit of claim 1;
   a comparator configured to compare timings of the edges of the two input signals to output the digital value;
   first and second delay compensation circuits each configured to delay a corresponding one of the two input signals by a delay amount corresponding to a signal delay in the comparator; and
   a routing circuit configured to switch, according to the digital value, connections between each of outputs of the first and second delay compensation circuits and two inputs of the time difference adjustment circuit, between straight connection and cross connection.

3. A time-to-digital converter for converting a time difference between edges of two input signals to a digital code, comprising:
   a plurality of cascade-connected time-to-digital converter circuits each of which is the time-to-digital converter circuit of claim 2, wherein
   a delay time of each of the time difference adjustment circuits in the time-to-digital converter circuits is set such that the delay time is reduced by a factor of two sequentially from the time-to-digital converter circuit in a first stage.

4. A delay circuit comprising:

a plurality of cascade-connected minimum-delay units each including first and second transistors of a first polarity and third and fourth transistors of a second polarity, wherein a drain of the first transistor is coupled to a drain of the third transistor, a drain of the second transistor is coupled to a drain of the fourth transistor, the drains of the first and third transistors are coupled to a gate of the fourth transistor, an input signal to each of the minimum-delay units is coupled to a gate of the first transistor, an output signal of each of the minimum-delay units is supplied from the drains of the second and fourth transistors, and first and second reset signals are respectively coupled to gates of the second and third transistors.

* * * * *